United States Patent
Arambepola

(10) Patent No.: US 7,302,024 B2
(45) Date of Patent: *Nov. 27, 2007

(54) METHOD OF AND APPARATUS FOR DETECTING IMPULSIVE NOISE, METHOD OF OPERATING A DEMODULATOR, DEMODULATOR AND RADIO RECEIVER

(75) Inventor: Bernard Arambepola, London (GB)

(73) Assignee: Intel Corporation, Santa Clara, CA (US)

( * ) Notice: Subject to any disclaimer, the term of this patent is extended or adjusted under 35 U.S.C. 154(b) by 822 days.

This patent is subject to a terminal disclaimer.

(21) Appl. No.: 10/283,915

(22) Filed: Oct. 30, 2002

(65) Prior Publication Data

US 2003/0099287 A1    May 29, 2003

(30) Foreign Application Priority Data

Oct. 31, 2001 (GB) .................................. 0126067.8

(51) Int. Cl.
*H04L 1/02* (2006.01)
*H04L 1/00* (2006.01)
*H04Q 1/20* (2006.01)

(52) U.S. Cl. ...................... 375/347; 375/346; 375/227

(58) Field of Classification Search ................ 375/227, 375/263, 285, 346, 347, 344; 348/21, 192
See application file for complete search history.

(56) References Cited

U.S. PATENT DOCUMENTS 3,840,891 A * 10/1974 Hellwarth .................... 360/40
4,154,980 A * 5/1979 Schmidt et al. ............... 381/13
4,353,093 A * 10/1982 Durbin et al. ............. 348/616

(Continued)

FOREIGN PATENT DOCUMENTS

EP           0763949         3/1997

(Continued)

OTHER PUBLICATIONS

Sanchez et al., "Impulsive Noise Measurements and Characterization in a UHF Digital TV Channel," *IEEE Transactions of Electromagnetic Compatibility*, vol. 41, No. 2, pp. 124-136 (May 1999).
"Summary report of some findings on impulsive interference in DVB-T reception," Interference Group Summary Report (Oct. 2000).

*Primary Examiner*—Mohammed Ghayour
*Assistant Examiner*—Lawrence Williams
(74) *Attorney, Agent, or Firm*—Blakely, Sokoloff, Taylor & Zafman LLP

(57) ABSTRACT

In a digital receiver for receiving COFDM modulated television signals or the like, consecutive samples are compared with a detection threshold and the number of samples having amplitudes greater than the threshold is determined. This is compared with a further threshold and, if the number of such samples exceeds the further threshold, affected samples are blanked to zero. Similarly, an automatic gain control loop is disabled when the samples are blanked. A demodulator forms the difference in phase of pilot carriers from symbol to symbol. If the variance of the phase differences exceeds an averaged value, this indicates the presence of impulsive noise and is used to inhibit signal correction techniques within the demodulator. Noise energy is thus reduced and propagation of effects resulting from impulsive noise from symbol to symbol is substantially reduced.

34 Claims, 5 Drawing Sheets

U.S. PATENT DOCUMENTS

| | | | |
|---|---|---|---|
| 5,507,037 A * | 4/1996 | Bartkowiak et al. | 455/296 |
| 5,586,192 A | 12/1996 | De Bijl et al. | |
| 5,794,136 A * | 8/1998 | Buchwald et al. | 455/334 |
| 5,867,539 A * | 2/1999 | Koslov | 375/346 |
| 6,122,332 A * | 9/2000 | Ogata et al. | 375/346 |
| 6,181,714 B1 | 1/2001 | Isaksson et al. | |
| 6,317,473 B1 * | 11/2001 | Stott et al. | 375/344 |
| 6,320,918 B1 * | 11/2001 | Walker et al. | 375/346 |
| 6,647,070 B1 * | 11/2003 | Shalvi et al. | 375/285 |
| 6,920,194 B2 * | 7/2005 | Stopler et al. | 375/349 |
| 2001/0018331 A1 | 8/2001 | Kuehn | |
| 2007/0030931 A1 * | 2/2007 | Arambepola | 375/346 |

FOREIGN PATENT DOCUMENTS

| | | |
|---|---|---|
| EP | 0802669 A2 | 10/1997 |
| EP | 1043874 | 10/2000 |
| EP | 1043874 A2 | 10/2000 |
| EP | 1180851 A2 | 2/2002 |
| EP | 0930719 | 4/2005 |

\* cited by examiner

METHOD OF AND APPARATUS FOR DETECTING IMPULSIVE NOISE, METHOD OF OPERATING A DEMODULATOR, DEMODULATOR AND RADIO RECEIVER

TECHNICAL FIELD

The present invention relates to a method of and apparatus for detecting impulsive noise in a stream of signal samples in a radio receiver. The invention also relates to a method of operating a demodulator and to a demodulator. The invention further relates to a receiver incorporating such a demodulator and/or such an apparatus. The techniques disclosed herein are applicable to, for example, any type of digital communication receiver, of which particular examples are digital audio broadcast (DAB) receivers and digital terrestrial television (DTT) receivers.

BACKGROUND

Digital receivers such as DTT receivers are susceptible to various forms of noise which can disrupt reception. Such receivers are particularly susceptible to impulsive noise, for example caused by domestic electrical appliances and by vehicle ignition systems. Impulsive noise comprises one or more discrete relatively high amplitude pulses of relatively short duration and can disrupt reception to an unacceptable extent. This is discussed in "Impulsive Noise Measurements and Characterisations in a UHF Digital TV Channel", IEEE Transactions on Electromagnetic Compatibility, Vol. 41, No. 2, May 1999.

In order to attempt to overcome this problem, it is known to perform impulse suppression by zero substitution or "blanking to zero" of the data-carrying signal within a television receiver. In particular, if the noise impulses can be detected, then the data can be blanked to zero so as to attempt to remove the noise energy from the signal, for example supplied to the digital demodulator of the receiver. In order to attempt to detect noise impulses, the absolute value of each digital sample, following analog-to-digital conversion within the receiver, is compared with a predetermined threshold. If a sample exceeds this threshold, it is replaced with zero. Such techniques are disclosed, for example, in "Summary report of some findings on impulsive interference into DVB-T reception", 10 May 2000, Report published by the BBC Research and Development. However, it has been found that such techniques are of limited use in detecting impulsive noise and do not improve reception sufficiently to avoid undesirable visual artefacts appearing in television pictures.

SUMMARY

According to a first aspect of the invention, there is provided a method of detecting impulsive noise in a stream of sets of samples in a radio receiver, comprising the steps of:

(a) comparing a value based on an amplitude of the or each sample of each set with the or each of a number J of thresholds $T_j$, where J is greater than zero;

(b) determining each number $n_j$ of sets of samples in each $N_j$ consecutive sets of samples for which the value is greater than $T_j$ for each value of j such that $1 \leq j \leq J$; and (c) indicating a noise impulse when the or every number $n_j$ is greater than a or a respective first number $X_j$.

J may be equal to 1.

Each set may comprise one sample and the value may comprise the amplitude of each sample.

Each set may comprise orthogonal first and second samples. The value may comprise the larger of the amplitudes of the first and second samples.

The step (a) may be performed for each set $S_i$ of the samples in turn in order of arrival with the or each first threshold, where i indicates the order of arrival. The step (b) may comprise determining the or each $n_j$ from the or each $N_j$ consecutive sets of samples, of which the most recent is $S_i$. The step (c) may comprise indicating the start of the noise impulse when the or every $n_j$ rises above the or the respective first number $X_j$. The step (c) may comprise indicating the end of the noise impulse when the or every $n_j$ falls below a respective second number $Y_j$. The or each second number $Y_j$ may be smaller than the or the respective first number $X_j$.

The method may comprise the additional step (d) of performing an action in response to the step (c) indicating a noise impulse. The step (d) may comprise replacing the or each sample of at least one of the sets with a replacement sample of reduced amplitude. The replacement sample may have zero amplitude. The step (d) may comprise replacing the or each sample of each set for which the step (c) indicates the presence of a noise impulse. The step (d) may comprise disabling the replacement after the samples of a third number of consecutive ones of the sets have been replaced.

The step (d) may comprise acting on an automatic gain control arrangement of the receiver. The automatic gain control arrangement may control the gain of the receiver on the basis of a comparison between the samples and an average value based on the samples and the step (d) may comprise preventing the sample or samples of at least one of the sets from contributing to the average value. The step (d) may comprise preventing the or each sample of each set for which the step (c) indicates the presence of a noise impulse from contributing to the average value. The step (d) may comprise permitting the contribution to the average value after the samples of a fourth number of consecutive ones of the sets have been prevented from contributing to the average value.

The samples may be digital samples.

According to a second aspect of the invention, there is provided a method of operating a demodulator for demodulating a modulated signal, comprising the steps of:

(i) detecting noise in at least one pilot carrier of the modulated signal; and (ii) preventing the detected noise from substantially influencing signal correction within the demodulator.

The modulated signal may be a digital signal.

The modulated signal may be a baseband signal.

The modulated signal may be an orthogonal frequency division multiplexed signal, such as a coded orthogonal frequency division multiplexed signal. The step (i) may comprise forming the difference between the phase in a first symbol and the phase in a second symbol preceding the first symbol of the at least one pilot carrier. The second symbol may immediately precede the first symbol.

The step (i) may be repeated with each of at least some of the symbols of the at least one pilot carrier as the first symbol.

There may be a plurality of pilot carriers and the step (i) may comprise forming the variance of the phase differences for the or each first symbol. The or each variance may be compared with a second threshold for determining the presence of a noise impulse. The second threshold may be formed by averaging the variances. The or each variance associated with a noise impulse may be excluded from the averaging.

The second threshold may comprise the sum of the variance average and a predetermined amount.

The step (ii) may comprise preventing a portion of the modulated signal, detected in the step (i) as containing noise, from contributing to the signal correction. The step (ii) may comprise inhibiting frequency response averaging in the demodulator. The step (ii) may comprise inhibiting contribution to channel state information. The step (ii) may comprise inhibiting a carrier recovery loop in the demodulator. The step (ii) may comprise inhibiting a timing recovery loop in the demodulator.

The step (ii) may be disabled when the step (i) detects noise for longer than a predetermined duration.

The method according to the first aspect of the invention may be followed by the method according to the second aspect of the invention.

According to a third aspect of the invention, there is provided an apparatus for detecting impulsive noise in a stream of sets of samples in a radio receiver, comprising: a comparator for comparing a value based on an amplitude of the or each sample of each set with the or each of a number J of thresholds $T_j$, where J is greater than zero; determining means for determining each number $n_j$ of sets of samples in each $N_j$ consecutive sets of samples for which the value is greater than $T_j$ for each value of j such that $1 \leq j \leq J$; and indicating means for indicating a noise impulse when the or every number $n_j$ is greater than a or a respective first number $X_j$.

J may be equal to one.

Each set may comprise one sample and the value may comprise the amplitude of each sample.

Each set may comprise orthogonal first and second samples. The value may comprise the larger of the amplitudes of the first and second samples.

The comparator may be arranged to perform the comparison for each set Si of samples in turn in order of arrival with the or each first threshold, where i indicates the order of arrival. The determining means may be arranged to determine the or each $n_j$ from the or each $N_j$ consecutive sets of samples, of which the most recent is Si. The indicating means may be arranged to indicate the start of the noise impulse when the or every $n_j$ rises above the or the respective first number $X_j$. The indicating means may be arranged to indicate the end of the noise impulse when the or every $n_j$ falls below a respective second number $Y_j$. The or each second number $Y_j$ may be smaller than the first number $X_j$.

The apparatus may comprise action performing means for performing an action in response to indication by the indicating means of a noise impulse. The action performing means may be arranged to replace the or each sample of at least one of the sets with a replacement sample of reduced amplitude. The replacement sample may have zero amplitude. The action performing means may be arranged to replace the or each of the samples or each set for which the indicating means indicates the presence of a noise impulse. The action performing means may be arranged to be disabled after the samples of a third number of consecutive ones of the sets have been replaced.

According to a fourth aspect of the invention, there is provided a radio receiver comprising an apparatus according to the third aspect of the invention.

The receiver may comprise an automatic gain control arrangement, the action performing means being arranged to act on the automatic gain control arrangement. The automatic gain control arrangement may be arranged to control the gain of the receiver on the basis of a comparison between the samples and an average value based on the samples and the action performing means may be arranged to prevent the sample or samples of at least one of the sets from contributing to the average value. The action performing means may be arranged to prevent the or each sample of each set for which the indicating means indicates the presence of a noise impulse from contributing to the average value. The action performing means may be arranged to permit the contribution to the average value after the samples of a fourth number of consecutive ones of the sets have been prevented from contributing to the average value.

The receiver may comprise an analogue-to-digital converter and the apparatus may be arranged to receive the samples from the converter. The automatic gain control arrangement may comprise a gain-controlled stage ahead of the converter.

According to a fifth aspect of the invention, there is provided a demodulator for demodulating a modulated signal, comprising a detector for detecting noise in at least one pilot carrier of the modulated signal, correcting means for performing signal correction, and preventing means for preventing the detected noise from substantially influencing the correcting means.

The modulated signal may be a digital signal.

The modulated signal may be a baseband signal.

The modulated signal may be an orthogonal frequency division multiplexed signal, such as a coded orthogonal frequency division multiplexed signal. The detector may be arranged to form the difference between the phase in a first symbol and the phase in a second symbol preceding the first symbol of the at least one pilot carrier. The second symbol may immediately proceed the first symbol.

The detector may be arranged to repeat the detection with each of at least some of the symbols of the at least one pilot carrier as the first symbol.

There may be a plurality of pilot carriers and the detector may be arranged to form the variance of the phase differences for the or each first symbol. The detector may be arranged to compare the or each variance with a second threshold for determining the presence of a noise impulse. The detector may be arranged to form the second threshold by averaging the variances. The detector may be arranged to exclude from the averaging the or each variance associated with a noise impulse. The detector may be arranged to form the second threshold as the sum of the variance average and a predetermined amount.

The preventing means may be arranged to prevent a portion of the modulated signal, detected by the detector as containing noise, from contributing to the signal correction in the correcting means. The correcting means may comprise frequency response averaging means. The correcting means may comprise channel state information generating means. The correcting means may comprise a carrier recovery loop. The correcting means may comprise a timing recovery loop.

The preventing means may be arranged to be disabled when the detecting means detects noise for longer than a predetermined duration.

According to a sixth aspect of the invention, there is provided a radio receiver comprising a demodulator according to the fifth aspect of the invention.

According to a seventh aspect of the invention, there is provided a radio receiver according to the fourth aspect of the invention comprising a demodulator according to the fifth aspect of the invention.

It is thus possible to provide a more reliable detection of impulsive noise so that those samples which are affected by such noise may be blanked in order to reduce the impulsive power, for example entering a demodulator of a receiver. It is also possible to reduce the effect of impulsive noise on automatic gain control within such a receiver.

It is further possible to reduce the propagation of impulse noise effects from symbol to symbol within a demodulator of the digital type. As a result, the number of symbol errors can be substantially reduced and the reception performance of a receiver can be improved substantially as compared with previously known arrangements. For example, impulsive noise which would previously have caused unacceptable perceptible artefacts in the demodulated signal can be handled such that such perceptible artefacts are eliminated or substantially reduced.

DETAILED DESCRIPTION

Figure 1:
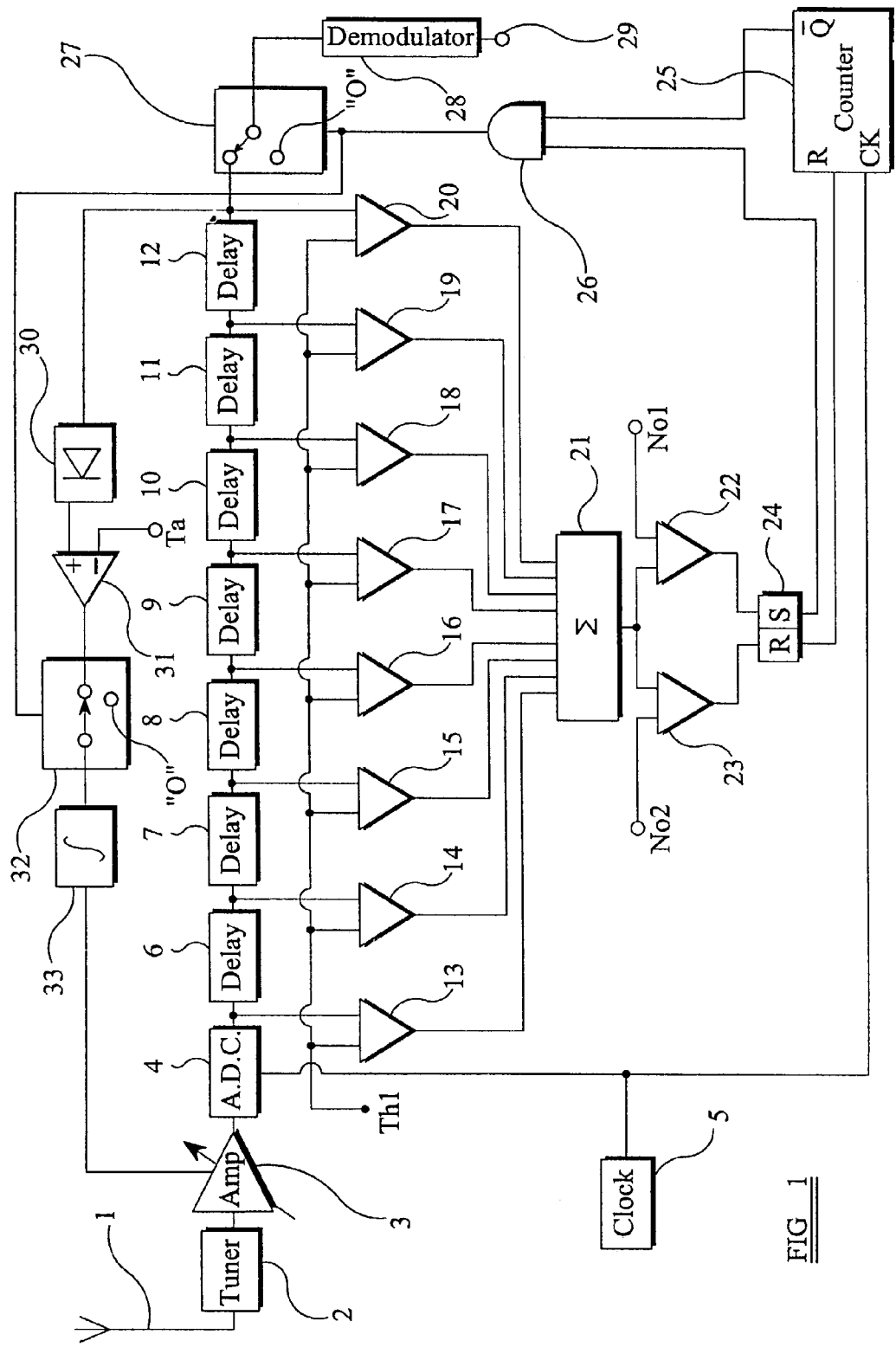
FIG. 1 is a block functional diagram of a receiver constituting an embodiment of the invention.

The receiver shown in FIG. 1 is for receiving television signals encoded in accordance with the coded orthogonal frequency division multiplexed standard. In this example, the modulated and encoded signals are transmitted terrestrially in accordance with the digital video broadcast (DVB) standard to an aerial 1. The aerial 1 is connected to the input of a tuner 2, which selects a desired channel for reception while substantially rejecting other channels present in the signal at the aerial 1. The tuner may be of any suitable type and converts the received channel to an intermediate frequency signal at its output. The intermediate frequency may, for example, be of the order of 36 MHz, about which the channel is centred. Alternatively, the intermediate frequency may be zero or near zero such that the output of the tuner 2 is in the baseband. Tuners for performing this function are well known and the tuner 2 will not therefore be described further.

The output of the tuner 2 is supplied to the input of an intermediate frequency amplifier 3 whose gain is electronically controllable and which forms part of an automatic gain control (AGC) circuit of the receiver. The output of the amplifier 3 is connected to the input of an analog-to-digital converter (ADC) 4, which samples the intermediate frequency signal at a sample rate determined by a clock 5 and converts each sample to a digital code, for example comprising ten bits in parallel.

The output of the ADC 4 is connected to the input of a chain of seven delay circuits 6 to 12, each of which forwards the digital sample at its input to its output with a delay of one sample period. Eight consecutive samples are therefore simultaneously present at the output of the ADC 4 and at the outputs of the delay circuits 6 to 12. The eight consecutive samples are supplied to the first inputs of respective comparators 13 to 20, whose second inputs are connected together to receive a first threshold Th1. Each of the comparators 13 to 20 compares the absolute value of the sample at its first input with the first threshold Th1. If the threshold is exceeded, the comparator supplies a logic level 1 at its output. Otherwise, the comparator supplies a logic level zero at its output.

The first threshold Th1 has a value which discriminates between the amplitude of a sample corresponding to a desired signal and the amplitude of a noise impulse. Because a COFDM signal is a sum of many (substantially) independent signals, the probability distribution of the amplitude approaches a Gaussian distribution. The standard deviation of this distribution can be defined and confirmed using experimental or simulated data. The first threshold Th1 can then be selected such that the probability of its being exceeded is small, for example of the order of 0.0002. However, any suitable technique for generating the first threshold Th1 may be used.

The outputs of the comparators 13 to 20 are supplied to the inputs of a summer ($\Sigma$) 21, which adds the eight 1 bit values from the comparators to give a four bit number in the range from zero to 8. The output of the summer 21 is supplied to first inputs of comparators 22 and 23 whose second inputs receive first and second numbers No1 and No2, respectively, where the second number No2 is less than the first number No1. The outputs of the comparators 22 and 23 are connected to the set and reset inputs, respectively, of a set-reset circuit or bistable 24. When the number from the summer 21 exceeds the first number No1, the comparator 22 sets the circuit 24. When the comparator 23 detects that the number from the summer 21 is less than the second number No2, it resets the circuit 24.

The reset output of the circuit 24 is connected to the reset input of a counter 25, which has a clock input connected to receive the clock pulses from the clock 5. The set output from the circuit 24 is connected to the first input of an AND gate 26, whose second input is connected to a $\overline{Q}$ output of the counter 25. Whenever the circuit 24 is reset, it holds the counter 25 in a reset state so that the $\overline{Q}$ is at logic level one. However, because the signal on the other input of the gate 26 from the circuit 24 is at logic level zero, the output of the gate 26 is thus zero. When the circuit 24 is set, the reset input of the counter 25 is disabled and the counter thus counts the number of samples in accordance with the sampling clock pulses supplied by the clock 5 to the ADC 4. The circuit 24 supplies a logic level one signal to the first input of the gate 26 whose output is at logic level one. When the counter 25 reaches a predetermined state corresponding to counting a predetermined number of samples, the inverted decoded output $\overline{Q}$ falls to logic level zero and the gate 26 supplies a logic level zero at its output.

The output of the final delay circuit 12 is connected to one input of an electronic switch 27, whose other input is connected to receive a binary code representing zero. The output of the switch 27 is connected to the input of a demodulator 28 whose output 29 forms the output of the receiver. The output of the gate 26 is connected to a control input of the switch 27 such that the switch 27 connects the input of the demodulator 28 to the output of the delay circuit 12 when the gate output is at the logic level zero and connects the input of the demodulator 28 to receive the binary code representing zero when the output of the gate 26 is at the logic level 1.

The output of the delay circuit 12 is also connected to the input of an absolute value forming circuit 30 which is part of the AGC loop of the receiver. The output of the circuit 30 is supplied to a non-inverting input of a subtracter 31, whose inverting input is connected to receive a target value Ta representing the desired average absolute amplitude of the samples supplied to the demodulator 28. The subtracter 31 forms the difference by subtracting the target value Ta from the absolute value of the sample at the output of the delay circuit 12 and supplies this to a first input of another electronic switch 32, whose second input is connected to receive a signal representing zero. The output of the switch 32 is supplied to an AGC control circuit 33 which is illustrated as performing an integrating function. The circuit 33 supplies an analog output to the gain control input of the amplifier 3 so as to control the gain thereof.

The switch 32 has a control input which is connected to the output of the gate 26. Thus, when the gate 26 supplies at its output a logic level zero, the switch 32 connects the output of the subtracter 31 to the input of the control circuit 33. When the output of the gate 26 is at logic level 1, the switch 32 connects the input of the control circuit 33 to receive the zero signal.

In use, eight consecutive samples from the ADC 4 are compared with the first threshold Th1 in the comparators 13 to 20. Each comparator provides a one bit signal of zero when the sample at its input is less than the threshold and a signal of 1 when the threshold is exceeded, indicating that the sample has an excessively high amplitude and is therefore corrupted by a noise impulse. When a noise impulse is received by the receiver at the aerial 1, the relatively short noise impulse is extended because of the impulse response of the receiver comprising the tuner 2, the amplifier 3 and the ADC 4. The output of the summer 21 represents the number of samples in the eight consecutive samples currently being monitored with amplitudes exceeding the first threshold Th1. When the number of such samples exceeds the first number No1, the comparator 22 sets the circuit 24 to indicate the start of a noise impulse which, because of the spreading of the impulse, is likely to affect the sample at the output of the final delay circuit 22. The gate 26 controls the switch 27 so as to disconnect the demodulator input from the output of the delay circuit 12 and to connect it to receive "zero". Blanking of the received signal to zero thus commences.

In order to prevent the AGC circuit from responding to the noise impulse, the switch 32 likewise connects the input of the control circuit 33 to "zero". Because of the integrating nature of the control circuit 33, its output is held at a substantially constant level so that the gain of the amplifier 3 remains held and does not attempt to respond to the noise impulse.

When the number of samples with an amplitude exceeding the first threshold Th1 falls below the second number No2, the comparator 23 resets the circuit 24 so that the output of the gate 26 falls to logic level zero. This indicates the end of the noise pulse and the switch 27 reconnects the input of the demodulator 28 to receive the samples from the delay circuit 12. Simultaneously, the switch 32 connects the input of the control circuit 33 to the output of the subtracter 31 to resume normal control of the AGC loop.

In order to avoid an increase in the signal level causing permanent blanking of the samples from the delay circuit 12 and permanent disabling of the AGC loop, the counter 25 provides a "timeout" such that normal operation of the receiver is restored after a predetermined time period (defined in terms of a predetermined number of samples) after the start of detection of a noise impulse irrespective of whether the end of the impulse has been detected. The timeout period can be set in accordance with typical or maximum known impulse lengths and the impulse response of the receiver, which can generally be determined by calculation or experiment for a particular receiver configuration. This arrangement ensures that at least most noise impulses are blanked and the AGC loop does not respond, for example, to a series of such noise impulses whereas an increase in signal level will result in a limited number of blanked samples, which will not substantially affect operation of the demodulator 28, before the AGC loop responds to the changed signal level.

In the embodiment illustrated in FIG. 1, the number N of consecutive samples which are processed to determine the presence of a noise impulse is 8 so that seven delay circuits 6 to 12 are required. However, in a typical example, N is programmable between 8 and 15 with 12 being a typical value. In that case, No1 is typically 4 and No2 is typically 1. The threshold Th1 is typically 480 where the samples have an amplitude range from zero to 512 (for a 10 bit ADC 4 capable of achieving full scale). However, the numbers No1 and No2 and the threshold Th1 are also generally programmable so as to allow the best combination of parameters to be chosen for any particular application.

The receiver of FIG. 1 is intended for receiving coded orthogonal frequency division multiplex (COFDM) signals, which are made up of relatively large numbers of sinusoidal carriers or sub-carriers, each with a different frequency and a different phase angle dependent on the data used for modulation. There is therefore a small probability that some of these could add in-phase such that the output of the ADC 4 could exceed the first threshold Th1 in the absence of any additive noise impulse. If the probability of such an event is p, then this probability is a function of the first threshold Th1 and can be established empirically from an amplitude histogram of a large segment of COFDM data. In other words, if the decision to blank samples were based on the detection of a single sample exceeding the first threshold, there is a probability p of a false detection.

It may be assumed that events of the type "sample exceeds first threshold" are independent on the grounds that there are many carriers with different frequencies and "random" phase angles making up the COFDM signal. The phase angles are effectively random because the phase-modulated data is random or pseudo-random. Although the passage of a signal through bandpass filtering may mean that successive noise samples cannot be assumed to be uncorrelated, the assumption is reasonable for a window size i.e. N, which is not very small.

If the sample amplitudes are taken to be substantially independent, then the probability P of M or more samples out of N samples exceeding the first threshold is given by:

$$P = \sum_{i=M}^{N} {}^N C_i \cdot p^i (1-p)^{N-i}$$

For example, if the value of N is 12, the value of M is 5, and p is very small, then the probability P will be approximately equal to $792_p{}^5$. Because p is generally very small, the probability P is generally very much smaller than p so that the probability of false detection is greatly reduced. For example, if the threshold Th1 is chosen such that p is 2e-4, P becomes 2.5e-16. Some allowance has to be made for the possibility of some correlation in the COFDM sample amplitudes. However, the parameters N, M and Th1 can be selected so as to provide an acceptably low level of false detections.

Figure 2:
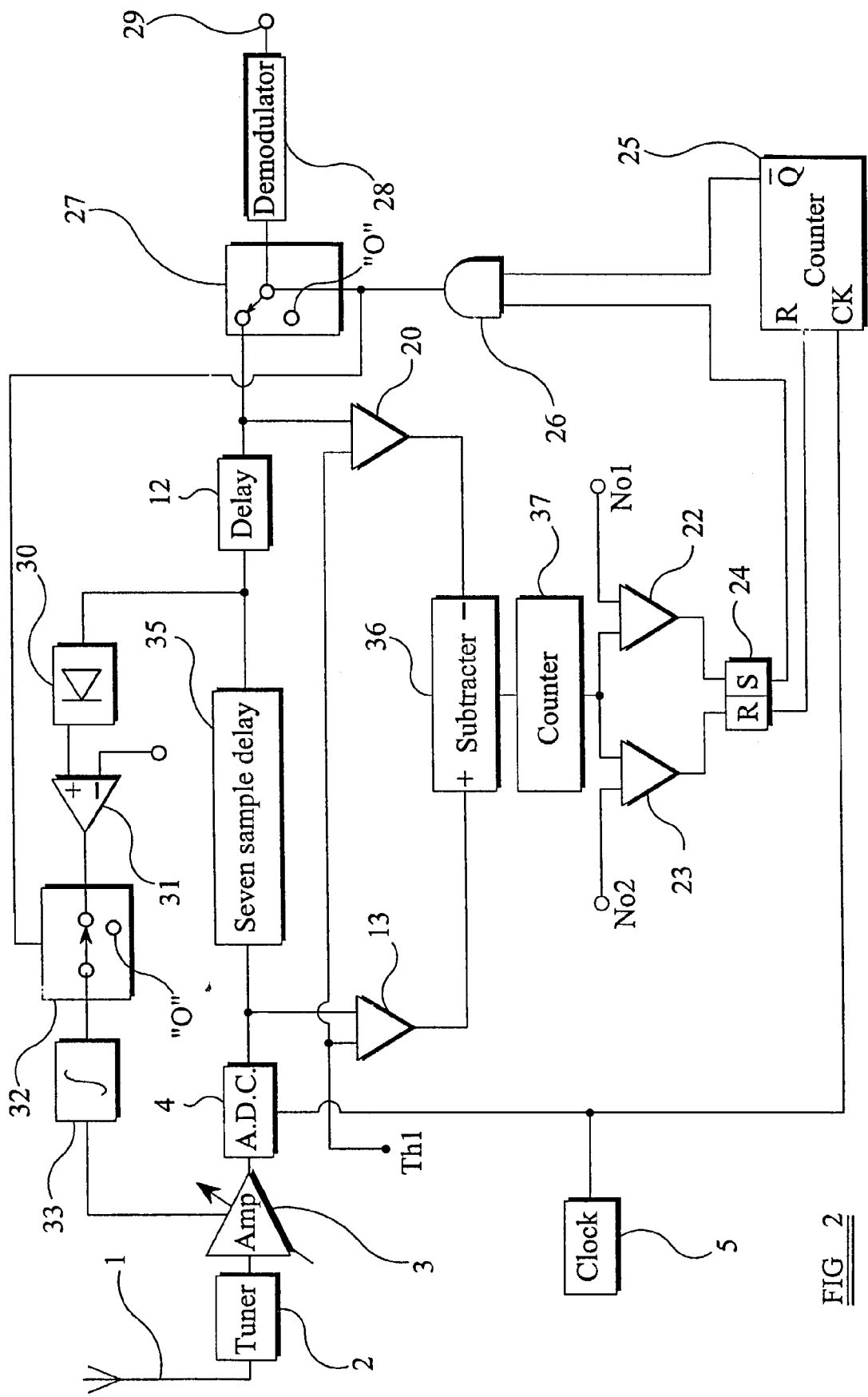
FIG. 2 is a block functional diagram of a receiver constituting another embodiment of the invention.

The receiver shown in FIG. 2 differs from that shown in FIG. 1 in the way in which the comparisons of the samples with the first threshold Th1 are performed. The delay circuits 6 to 11 are replaced by a delay circuit 35 which provides a seven sample delay and the comparators 14 to 19 are omitted. The summer 21 is replaced by a subtracter 36 and a counter 37. Thus, each sample entering the delay line comprising the delay circuits 35 and 12 and each sample leaving the delay line are compared with the first threshold Th1 and the one bit comparison results are supplied to the subtracter 36. The subtracter 36 is arranged such that, if the outputs of the comparators 13 and 20 are the same, no counting pulse is supplied to the counter 37. If the sample supplied to the comparator 13 exceeds the first threshold whereas the sample supplied to the comparator 20 is less than the first threshold, the subtracter 36 supplies a "1" to increment the counter 37 by one count. Conversely, if the sample supplied to the comparator 13 is less than the first threshold but the sample supplied to the comparator 20 is greater than the first threshold, the subtracter 36 supplies a −1 to the counter 37 which therefore decrements the count by 1. The counter 37 thus contains a "running total" of the number of samples in the sample window exceeding the first threshold. The remainder of the operation of the receiver of FIG. 2 is as described hereinbefore for the receiver of FIG. 1. However, the arrangement of FIG. 2 reduces the number of comparisons which have to be performed.

Although the receivers shown in FIGS. 1 and 2 are illustrated in the form of block functional diagrams, they may be embodied by any suitable hardware and/or software such that some or all of the blocks illustrated in FIGS. 1 and 2 do not have the form of corresponding discrete hardware circuits or functions. The receivers may be embodied by any suitable hardware and/or software for achieving the same or equivalent individual functions such that the overall function of sample blanking and AGC control are achieved.

Figure 3:
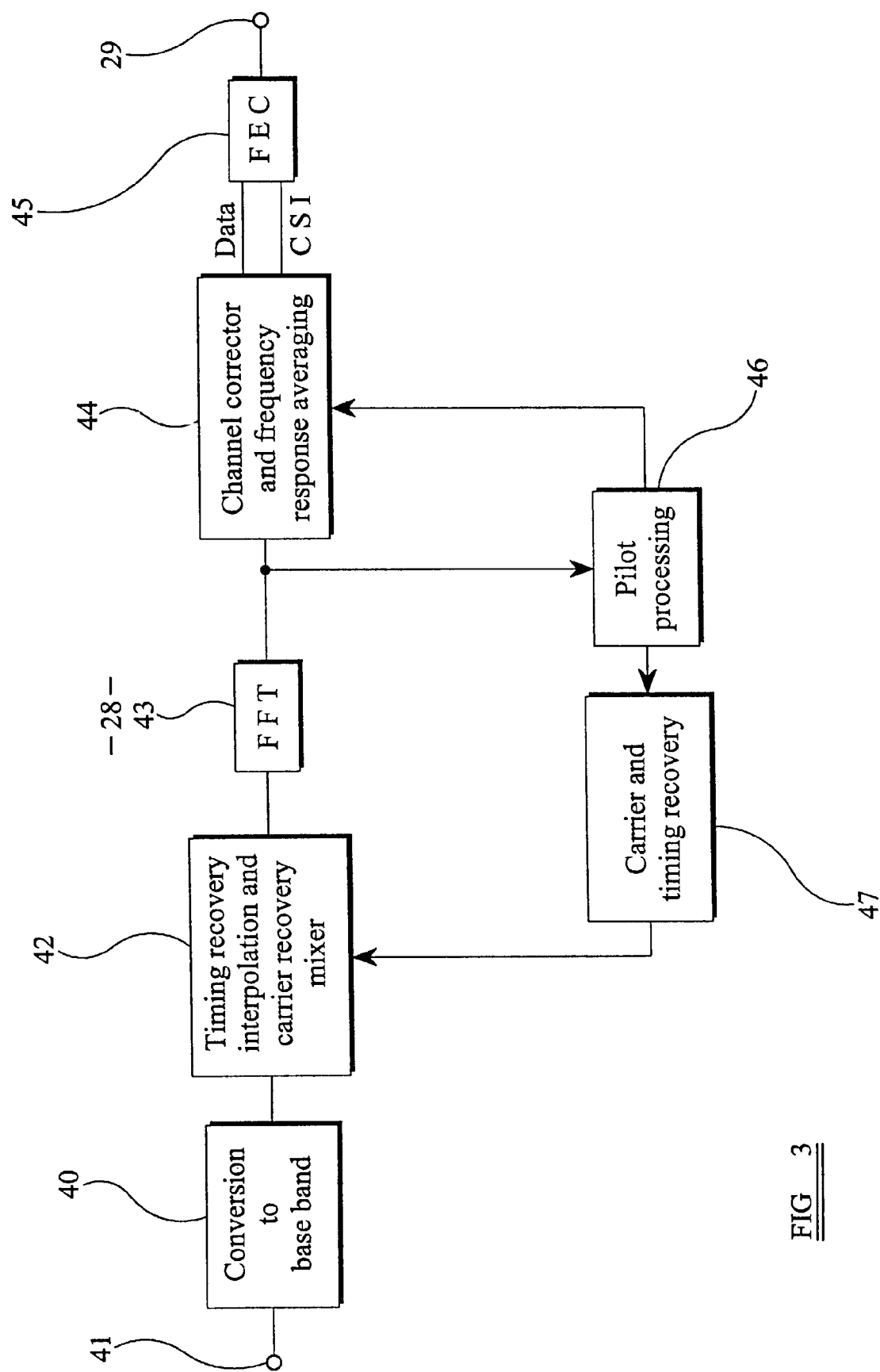
FIG. 3 is a block functional diagram of a demodulator of the receiver of FIG. 1 or FIG. 2.

An embodiment of the demodulator 28 of FIG. 1 or FIG. 2 is illustrated in FIG. 3 for demodulator a COFDM signal. Again, the demodulator is illustrated as functional blocks which may not represent the actual hardware or software structure of any particular example.

The demodulator 28 comprises a block 40 for converting the incoming sampled digitised intermediate frequency signal at an input 41 to baseband (if the signal is not already at baseband). The output of the block 40 is supplied to a block 42 for performing timing recovery interpolation and a carrier recovery mixing operation. The output of the block 42 is supplied to a block 43 which performs a fast Fourier transform (FFT), which converts incoming signals in the frequency domain to the time domain. The output of the block 43 is supplied to a channel corrector 44 whose outputs supply a data signal and channel state information (CSI) to a forward error correction (FEC) block 45, which performs forward error correction (and other signal processing which is not shown in FIG. 3) to provide the demodulated output signal at the output 29.

The output of the FFT block 43 is also supplied to a pilot processing block 46 for processing continuous pilot signals in the COFDM signal. Alternatively or additionally, the block 46 may process scattered pilot signals. The block 46 controls the channel corrector block 44 and supplies data for controlling carrier and timing recovery in a block 47 and frequency averaging in the block 44.

A typical COFDM signal, for example of the 8 MHz type used for digital terrestrial television broadcasting in Europe as disclosed in ETSI EN300 744 V1.3.1 (2000-08) "Digital Video Broadcasting (DVB); framing structure, channel coding and modulation for digital terrestrial television", has a bandwidth of (64/7) MHz divided into 2048 orthogonal carriers in the 2K mode or 8192 orthogonal carriers in the 8K mode. However, not all of these carriers are used. For example, edge carriers are forced to zero so as to prevent interference to adjacent analog or digital television channels. Thus, 1705 carriers in the 2K mode and 6817 carriers in the 8K mode are used for carrying the modulated information.

Some of these carriers are called "pilot carriers" and are used for demodulator synchronisation, equalisation to compensate for the effects of multipath, and transmission parameter signalling. The individual data carriers in the COFDM signal are quadrature amplitude modulated (QAM) whereas the pilot carriers are binary phase shift keying (BPSK) modulated. The COFDM signal is generated using an 8K or 2K point Inverse fast Fourier transform (IFFT).

In the DVB standard, there is a set of pilot carriers called "continuous pilot carriers" which occupy the same locations in every symbol. These continuous pilots are BPSK modulated but the modulation pattern or sequence is the same in every symbol. The phases of the continuous pilots are used as shown in FIG. 4 to identify symbols contaminated by impulsive noise so as to prevent the effects of this noise contamination from being propogated to other unaffected symbols.

Figure 4:
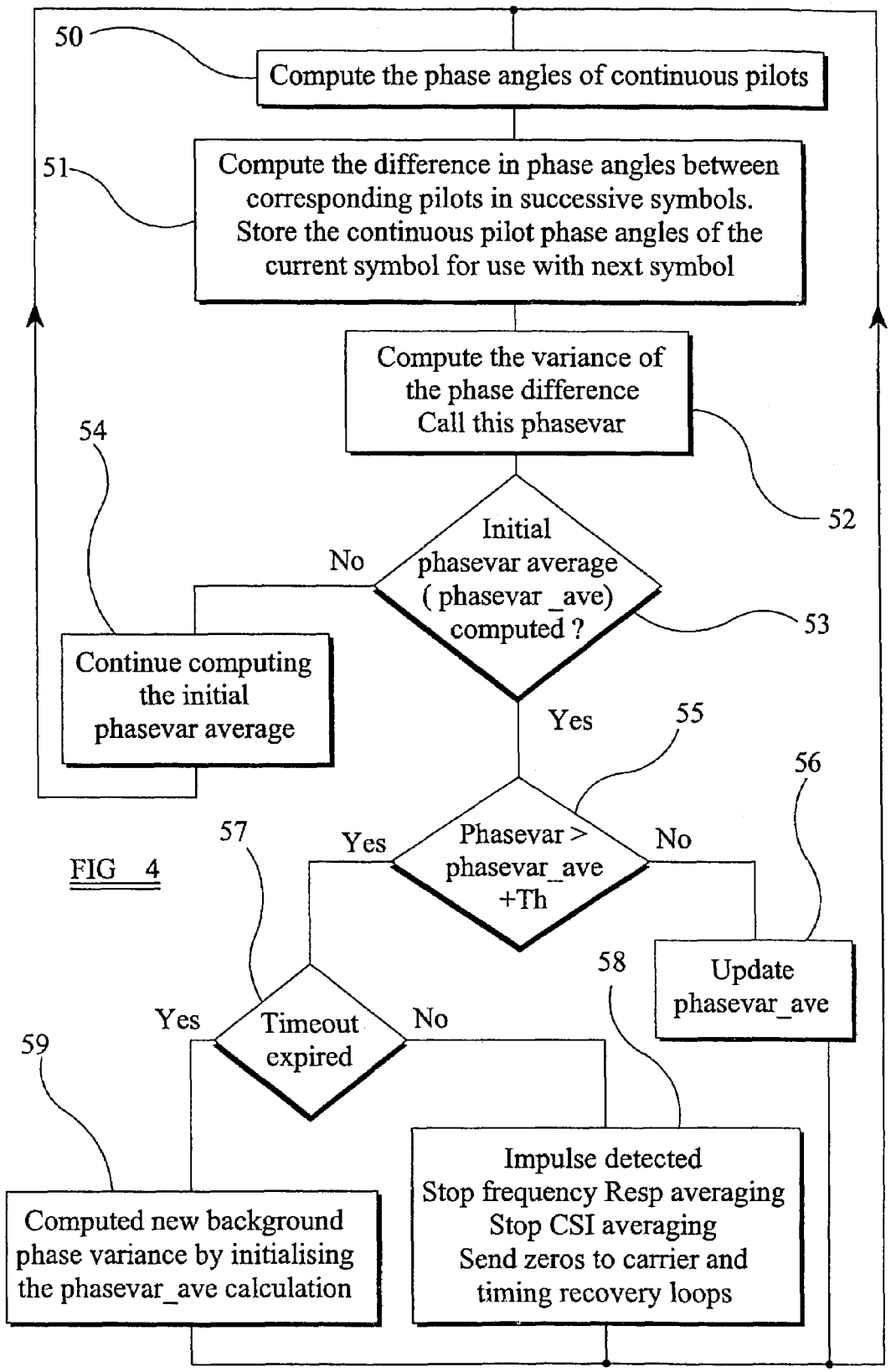
FIG. 4 is a flow diagram illustrating part of the operation of the demodulator of FIG. 3.

The processing illustrated in FIG. 4 is performed for each sample in turn demodulated by the demodulator 28 and this process is performed within the pilot processing block 46. At 50, the phase angles of the continuous pilots are determined. At 51, the difference between the phase of each continuous pilot calculated in the step 50 and the phase of the corresponding immediately preceding symbol continuous pilot is determined and the phases calculated in the step 50 are stored for use in the next process cycle. This subtraction substantially eliminates the phase modulation caused by BPSK modulation of the continuous pilots. Because this modulation sequence is the same in each symbol, taking the difference removes the modulation.

This subtraction also substantially eliminates phase distortion caused by the transmission channel from the transmitter to the aerial 1 and by the tuner. In particular, multipath can cause severe phase distortion across the frequency band. However, this phase distortion changes relatively slowly with time and so is substantially the same in successive symbols. Thus, distortion caused by multipath is substantially eliminated by forming the difference. Similarly, the phase response of the tuner 2 is substantially eliminated. A symbol corrupted by a noise impulse will also suffer substantial phase distortion. By forming the phase difference for each continuous pilot in consecutive symbols, the resulting difference will be dominated by the presence of any phase distortion resulting from a noise impulse and thus provides a measure of the presence of impulsive noise.

A step 52 determines the variance (PHASEVAR) in accordance with the expression:

$$\text{phase var} = \text{mean}\{\Delta\phi_i^2\} - (\text{mean}\{\Delta\phi_i\})^2$$
$$= \frac{1}{L}\sum_i \Delta\phi_i^2 - \left(\frac{1}{L}\sum_i \Delta\phi_i\right)^2$$

where $\Delta\phi_i$ is the ith phase difference and L is the number of pilots over which the phase variance has been computed.

As an alternative to calculating the phase variance, some other measure of variation about a mean may be calculated. An example of this is:

$$\left(\sum_i |\Delta\phi i| - \sum_i \Delta\phi i\right)/L$$

which requires less processing to perform. However, it is believed that calculating the phase variance is the preferred embodiment in terms of performance.

Figure 5:
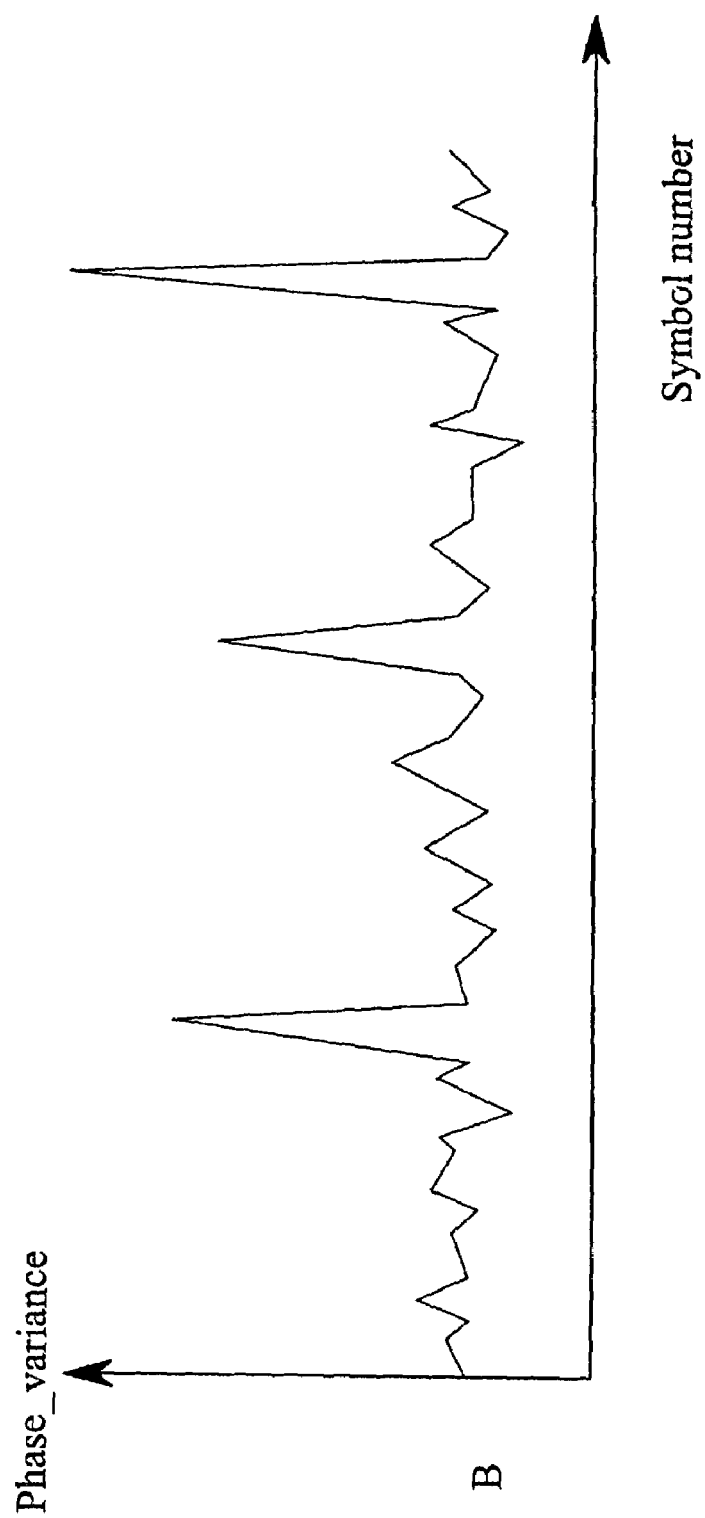
FIG. 5 is a graph of phase variance against symbol number illustrating part of the operation of the demodulator of FIG. 3.

If some of the symbols have been corrupted by impulsive noise, a phase variance pattern of the type illustrated in FIG. 5 occurs. Even in the absence of impulsive noise, there is a positive variance because of noise in the channel. The average background variance from this source is indicated at B and the level of this background variance is a function of the signal-to-noise ratio of the channel. However, in the presence of a noise impulse, a relatively large variance occurs as illustrated by each of the three large peaks in FIG. 5.

In order to detect the variance peaks caused by impulsive noise, it is necessary to determine a threshold on the basis of the average variance in the absence of impulsive noise. A step 53 determines whether an initial phase variance average has been determined and, if not, the initial variance average continues to be computed in a step 54. The steps 50 to 54 are performed for successive symbols until a suitable variance average has been determined for use in detecting the large variance peaks caused by noise impulses.

When the initial average has been determined, a step 55 determines whether the variance exceeds the sum of the average phase variance and a predetermined amount or threshold Th. For example, for the 2K mode of operation, a typical value of the predetermined amount is 0.035 rad$^2$. However, this "amount" may be made programmable and may be determined in field trials. If the variance is below the comparison value, a step 56 updates the variance average and control returns to the step 50 to await the arrival of the next symbol.

If the step 55 determines that the variance is greater than the comparison value, a step 57 determines whether a timeout has expired. The purpose of the timeout is to handle sudden increases in background noise level caused by a decrease in the signal-to-noise ratio of the channel. When such an increase occurs, it is initially detected as a noise impulse. However, if the condition persists at the expiry of the timeout, this will be recognised as an increase in background noise and not a noise impulse. A step 59 then starts to compute a new background phase variance by initialising the variance average and returning to the step 50.

If the timeout 57 has not expired, a step 58 indicates the detection of a noise impulse and takes the appropriate action to prevent this from having a substantial effect on the signal correction processes occurring within the demodulator.

The carrier and timing recovery loops in the block 47 comprise phase locked loops which are susceptible to errors caused by noise impulses. When the noise impulse is detected in the step 58, the error signals generated within these phase locked loops are set to zero and the integrating function within these loops causes the correction signals to stop varying or to vary only very slowly so that the loops remain substantially in lock. Frequency response equalisation is performed by determining the frequency response of the channel, which may have been substantially affected by multipath, on the basis of the pilot carriers and applying to the signal an inverse of the channel frequency response. The determination of the channel frequency response is performed by an averaging process and the step 58 ensures that information about the frequency response obtained from a symbol contaminated by a noise impulse does not take part in the averaging and so does not affect the frequency response compensation.

The channel state information (CSI) gives an indication of the quality of data demodulated from each of the carriers. For example, if a data carrier lies in a trough of the frequency response, its quality will be relatively poor and this is reflected in a poor CSI value. The FEC block 45 uses the CSI information to associate each demodulated bit with a degree of confidence and this information is used for correcting errors. The CSI is also generated through an averaging process and, when the step 58 detects a noise impulse, the corrupted symbol data are excluded from this averaging process.

These techniques within the demodulator 28 are used to improve the reception quality by detecting impulsive noise and reducing its effect on the demodulator output signal. In particular, by preventing it from influencing the various correction techniques performed within the demodulator 28, propagation of the effects of impulsive noise from symbol to symbol can be substantially eliminated or at least greatly reduced, for example to the point where error correction performed in the block 45 can make the effects imperceptible or sufficiently imperceptible to be acceptable.

By way of example, a simulation was performed to assess the effectiveness of the these techniques on a receiver of the type illustrated in the accompanying drawings. The simulation was based on an 8K mode COFDM television signal with a forward error correction code rate of 2/3. Data carriers of the COFDM signal were modulated using the 64-QAM non-hierarchical mode as defined in the DVB standard mentioned hereinbefore. A three microsecond impulse was placed at the centre of a COFDM symbol and this was repeated every ten symbols to a total of 110 symbols so that there were eleven impulses in the system. The background signal-to-noise ratio was 20 dB and hence 1 dB above the limit needed for quasi-error-free operation. The impulses were modelled as gated Gaussian noise and the impulse noise power was about 25 dB above the average signal power level. The same data were passed through the receiver model with all of the impulsive noise processing techniques described hereinbefore and without any of these techniques being in operation. The forward error correction module comprised a Viterbi decoder and a reed-solomon decoder.

When the impulse suppression techniques were active, there were only seven bit errors after the Viterbi decoder and these were easily corrected by the reed-solomon decoder so that there were no errors in the MPEG signal at the receiver output. When the impulse suppression was disabled, there were 23844 bit errors after the Viterbi decoder. The reed-solomon decoder was unable to correct many of these errors with the result that there were 225 uncorrectable MPEG packets in the receiver output. Thus, without the impulse correction, a complete television picture would have been corrupted by this representative impulse sequence. The use of these impulse suppression techniques thus provided a greatly improved performance in the presence of this impulse sequence, which is representative of the type of impulse noise which may be encountered by typical use of such receivers.

Various modifications may be made within the scope of the invention. For example, although the embodiments shown in FIGS. 1 and 2 illustrate a stream of single samples produced by the ADC 4, the ADC 4 may be an ADC arrangement which produces a stream of sets of samples where each set comprises more than one sample. For example, where the tuner 2 produces "orthogonal" signals representing in-phase (I) and quadrature (Q) components of the modulated signal, the ADC 4 may comprise two ADCs so that the sets of samples each comprise two samples representing the I and Q components. In such a case, the samples of each set pass through respective delay arrangements and a more complex comparison with a threshold is performed. For example, the larger of the amplitudes of the I and Q components may be compared with the first threshold Th1 to provide impulsive noise detection and, when a noise impulse is detected, both components are blanked so as to prevent corrupted samples from being passed to the demodulator 28 and from influencing the AGC circuit.

Also, it may not be necessary for samples to be blanked to zero. For example, it is possible for samples affected by impulsive noise to be replaced by samples of lower amplitude so as to reduce the effects of impulsive noise. If the replacement samples have sufficiently low amplitude, possibly even with the polarity periodically changing, the noise suppression performance which is achieved may be acceptable.

Although the embodiments shown in FIGS. 1 and 2 illustrate impulsive noise detection by the use of a single first threshold Th1, a multiple threshold comparison may be performed. Thus, the samples may be compared with two or more different thresholds and a noise impulse may be indicated only when the numbers of samples in respective numbers of consecutive samples all exceed respective thresholds.

The embodiments of FIGS. 1 and 2 also make use of the same parameter values to determine the start and end of samples affected by a noise impulse. However, it is also possible to use different parameter values for detecting the start and end of noise impulses. Such parameters may be made programmable so as to be set in accordance with the particular application.

The embodiments of FIGS. 1 and 2 make use of an arrangement for stopping or inhibiting blanking of the samples after a predetermined time period represented by a predetermined number of samples. In addition, these embodiments may be arranged to blank a predetermined minimum number of samples after impulsive noise has been detected. In such an arrangement, when a noise impulse is detected, a minimum number of samples is blanked even if the end of the noise impulse is detected before the minimum number of samples has been blanked. If the noise impulse still exists after the minimum number, blanking may continue to the end of the noise impulse or until the maximum number of samples has been blanked.

What is claimed is:

1. A method of detecting impulsive noise in a stream of sets of signal samples in a radio receiver, wherein each of said sets comprises at least one of said samples, said method comprising the steps of:
   (a) comparing a value based on an amplitude of said at least one sample of each said set with each of a number J of thresholds $T_j$, where J is greater than zero;
   (b) determining each number $n_j$ of said sets in each $N_j$ consecutive ones of said sets for which said value is greater than $T_j$ for each value of j such that $1 \leq j \leq j$; and
   (c) indicating a noise impulse when each said number $n_j$ is greater than a respective first number $X_j$;
wherein:
   said step (a) is performed for each said set of samples, Si in turn in order of arrival with a first threshold, where i indicates order of arrival;
   said step (b) compromises determining each said $n_j$ from each said $N_j$ consecutive sets, of which a most recent is Si;
   said step (c) compromises indicating a start of said noise impulse when every said $n_j$ rises above said respective first number $X_j$ and indicating an end of said noise impulse when every said $n_j$ falls below a respective number $Y_j$; and each said second number $Y_j$ is smaller than said respective first number $X_j$.

2. A method as claimed in claim 1, in which said number J is equal to one.

3. A method as claimed in claim 1, in which each said set comprises one sample and said value comprises an amplitude of each said sample.

4. A method as claimed in claim 1, in which each said set comprises orthogonal first and second samples.

5. A method as claimed in claim 4, in which said value comprises a larger of amplitudes of said first and second samples.

6. A method as claimed in claim 1, comprising the additional step (d) of performing an action in response to said step (c) indicating a noise impulse.

7. A method as claimed in claim 6, in which said step (d) comprises replacing each said sample of at least one of said sets with a replacement sample of reduced amplitude.

8. A method as claimed in claim 7, in which said replacement sample has zero amplitude.

9. A method as claimed in claim 7, in which: said step (b) comprises
   determining each said $n_j$ from each said $N_j$ consecutive sets, of which a most recent is $Si_j$ said step (c) comprises indicating a start of a noise impulse when every said $n_j$ rises above said respective first number $X_j$ and indicating an end of said noise impulse when every said $n_j$ falls below a respective second number $Y_j$ and said step (d) comprises replacing each said sample of each said set for which said step (c) indicates a presence of said noise impulse.

10. A method as claimed in claim 9, in which said step (d) comprises disabling said replacement after said samples of a third number of consecutive ones of said sets have been replaced.

11. A method as claimed in claim 6, in which said step (d) comprises acting on an automatic gain control arrangement of said receiver.

12. A method as claimed in claim 11, in which said automatic gain control arrangement controls a gain of said receiver based on a comparison between said samples and an average value based on said samples and said step (d) comprises preventing each said sample of at least one of said sets from contributing to said average value, in which said step (c) comprises.

13. A method as claimed in claim 12 in which: said step (b) comprises determining each said $n_j$ from each said $N_j$ consecutive sets, of which a most recent is $Si_j$ said step (c) comprises indicating a start of a noise impulse when every said $n_j$ rises above said respective first number $X_j$ and indicating an end of said noise impulse when every said $n_j$ falls below a respective second number $Y_j$ and said step (d) comprises preventing each said sample of each said set for which the step (c) indicates a presence of said noise impulse from contributing to said average value.

14. A method as claimed in claim 13, in which said step (d) comprises permitting a contribution to said average value after the said samples of a fourth number of consecutive ones of said sets have been prevented from contributing to said average value.

15. A method as claimed in claim 1, in which said samples are digital samples.

16. A method as claimed in claim 1, further comprising a method of operating a demodulator for demodulating a modulated signal, comprising the steps of:
   (i) detecting noise in at least one pilot carrier of said modulated signal; and
   (ii) preventing said detected noise from substantially influencing a signal correction within said demodulator.

17. An apparatus for detecting impulsive noise in a stream of sets of samples in a radio receiver, wherein each of said sets comprises at least one of said samples, said apparatus comprising: a comparator for comparing a value based on an amplitude of each said sample of each said set with each of a number J of thresholds $T_j$, where J is greater than zero; determining means for determining each number $n_j$ of said sets in each $N_j$ consecutive ones of said sets for which the value is greater than $T_j$ for each value of j such that $1 \leq j \leq J$; and indicating means for indicating a noise impulse when every said number $n_j$ is greater than a respective first number $X_j$ wherein: said comparator is arranged to perform a comparison for each said set of signal samples, Si in turn in order of arrival with each said first threshold, wherein i indicates said order of arrival; said determining means is arranged to determine each said $n_j$ from the or each said $N_j$ consecutive sets of samples, of which a most recent is Si; said indicating means is arranged to indicate a start of said noise impulse when ever said $n_j$ rises above said respective first number $X_j$; and an end of said noise impulse when every said $n_j$ falls below a respective second number $Y_j$; and each said second number $Y_j$ is smaller than said respective first number $X_j$.

18. An apparatus as claimed in claim 17, in which said number J is equal to one.

19. An apparatus as claimed in claim 17, in which each said set comprises one sample and said value comprises an amplitude of each said sample.

20. An apparatus as claimed in claim 17, in which each said set comprises orthogonal first and second samples.

21. An apparatus as claimed in claim 20, in which said value comprises a larger of amplitudes of said first and second sample.

22. An apparatus as claimed in claim 17, comprising action performing means for performing an action in response to said indication by said indicating means of said noise impulse.

23. An apparatus as claimed in claim 22, in which said action performing means is arranged to replace each said sample of at least one of said sets with a replacement sample of reduced amplitude.

24. An apparatus as claimed in claim 23, in which said replacement sample has zero amplitude.

25. An apparatus as claimed in claim 23, in which: said comparator is arranged to perform a comparison of each said set $S_j$ in turn in order of arrival with each said first threshold, where i indicates said order of arrival; said determining means is arranged to determine each said $n_j$ from each said $N_j$ consecutive ones of said sets, of which a most recent is $S_i$; said indicating means is arranged to indicate a start of said noise impulse when every said $n_j$ rises above said respective first number $X_j$ and to indicate an end of said noise impulse when every said $n_j$ falls below a respective second number $Y_j$; and said action performing means is ranged to replace each said sample of each said set for which said indicating means indicates a presence of said noise impulse.

26. An apparatus as claimed in claim 25, in which said action performing means is arranged to be disabled after said samples of a third number of consecutive ones of said sets have been replaced.

27. A radio receiver comprising an apparatus as claimed in claim 17.

28. A receiver as claimed in claim 27, comprising an automatic gain control arrangement and action performing means for acting on said automatic gain control arrangement in response to said indication by said indicating means of said noise impulse.

29. A receiver as claimed in claim 28, in which said automatic gain control arrangement is arranged to control a gain of said receiver based on a comparison between said samples and an average value based on said samples and said action performing means is arranged to prevent each said sample of at least one of said sets from contributing to said average value.

30. A receiver as claimed in claim 29, in which: said comparator is arranged to perform a comparison of each said set $S_i$ in turn in order of arrival with each said first threshold, where i indicates said order of arrival; said determining means is arranged to determine each said $n_j$ from each said $N_j$ consecutive ones of said sets, of which a most recent is $S_i$; said indicating means is arranged to indicate a start of said noise impulse when every said $n_j$ rises above said respective first number $X_j$ and to indicate an end of said noise impulse when every said $n_j$ falls below a respective second number $Y_j$; and said action performing means is arranged to prevent each said sample of each said set for which said indicating means indicates a presence of said noise impulse from contributing to said average value.

31. A receiver as claimed in claim 30, in which said action performing means is arranged to permit a contribution to said average value after said samples of a fourth number of consecutive ones of said sets have been prevented from contributing to said average value.

32. A receiver as claimed in claim 27, comprising an analog-to-digital converter, said apparatus being arranged to receive said samples from said converter.

33. A receiver as claimed in claim 32, comprising an automatic gain control arrangement having a gain-controlled stage ahead of the converter.

34. A radio receiver as claimed in claim 27, further comprising a demodulator for demodulating a modulated signal, comprising a detector noise in at least one pilot carrier of said modulated signal, correcting means for performing signal correction, and preventing means for preventing said detected noise from substantially influencing said correcting means.

* * * * *

UNITED STATES PATENT AND TRADEMARK OFFICE
CERTIFICATE OF CORRECTION

PATENT NO. : 7,302,024 B2  Page 1 of 1
APPLICATION NO. : 10/283915
DATED : November 27, 2007
INVENTOR(S) : Arambepola It is certified that error appears in the above-identified patent and that said Letters Patent is hereby corrected as shown below:

In column 16, at line 8, delete "ranged" and insert --arranged--.

Signed and Sealed this

Twenty-seventh Day of May, 2008

JON W. DUDAS
*Director of the United States Patent and Trademark Office*